(12) United States Patent
Yamauchi

(10) Patent No.: US 7,214,997 B2
(45) Date of Patent: May 8, 2007

(54) INTEGRATED OPTICAL DEVICE

(75) Inventor: Kiyoshi Yamauchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 466 days.

(21) Appl. No.: 10/817,841

(22) Filed: Apr. 6, 2004

(65) Prior Publication Data

US 2004/0202212 A1    Oct. 14, 2004

(30) Foreign Application Priority Data

Apr. 10, 2003   (JP)   ............... 2003-106155

(51) Int. Cl.
*H01L 31/0232* (2006.01)
*H01L 23/12* (2006.01)

(52) U.S. Cl. .............. 257/432; 257/433; 257/435; 257/E23.116; 372/75; 372/36; 385/14; 385/92; 385/94

(58) Field of Classification Search .......... 257/432, 257/433, 435, 704, 710, E23.116; 372/36, 372/75; 385/14, 92, 94
See application file for complete search history.

(56) References Cited

U.S. PATENT DOCUMENTS 4,733,067 A   3/1988  Oinoue et al.
5,350,916 A   9/1994  Bierhoff et al.
5,867,469 A   2/1999  Tanaka et al.
6,542,447 B1  4/2003  Matsuo et al.
2001/0019531 A1  9/2001  Sugawara
2004/0017004 A1*  1/2004  Kasai et al. ............... 257/704

FOREIGN PATENT DOCUMENTS

EP    1 115 112    7/2001

* cited by examiner

*Primary Examiner*—Jerome Jackson
*Assistant Examiner*—Joseph Nguyen
(74) *Attorney, Agent, or Firm*—Oblon, Spivak, McClelland, Maier & Neustadt, P.C.

(57) ABSTRACT

An integrated optical device allowing for higher flexibility in designing its outer shape and securing hermetic sealing is provided, which includes a ceramic substrate mounting a light source, a covering member fixed to the substrate for covering the light source, and a resin mold package for attaching the substrate, wherein a metal joint portion on the substrate and a metal joint portion on the covering member are joined, as well as a through-hole in the substrate or in covering member is sealed with a transparent material for hermetic sealing of the light source.

14 Claims, 6 Drawing Sheets

INTEGRATED OPTICAL DEVICE

CROSS REFERENCE TO RELATED APPLICATIONS

The present document is based on Japanese Priority Document JP2003-106155, filed in the Japanese Patent Office on Apr. 10, 2003, the entire contents of which being incorporated herein by reference.

BACKGROUND OF THE INVENTION

1. Field of the Invention

The present invention is, with respect to an integrated optical device, related to a technique for securing hermetic sealing of a light source portion including a light emitting element and allowing for higher flexibility in designing the outer shape of its packaging.

2. Description of Related Art

An integrated optical component including a light source such as a semiconductor laser, and/or a light receiving element using a photodiode is known to be suitable for down-sizing and low-profiling of the optical devices. For example, such a light emitting/receiving element is used in a head device (a so-called optical pick-up) for use in signal recording and reproduction to and from an optical recording medium.

In this type of devices and where a hermetic sealing of its light emitting element is not performed (plastic molding), a resin mold packaging is used, because it has a greater degree of freedom in the design of an outer shape due to the advantage of resin molding with a die. However, in the case where the light emitting element and the like are desired to be hermetically sealed in order to eliminate adverse effect from impurities in the ambient air, there occur problems that sufficient sealing cannot be achieved due to a limitation in characteristics of the resin materials to be used, or that a particular adhesive required for obtaining a necessary sealing capability cannot be used in a particular circumstance.

For example, as examples in which the hermetic sealing of the light emitting/receiving elements in its package is taken into consideration, there are proposed a method for sealing a ceramic package by bonding a sealing glass after disposing a light emitting element, a light receiving element, optical components and the like thereon, and a method for sealing a metal cap covering a metal package with a sealing glass. Also, there is known a method for fixing a light emitting element to a metal member, and attaching the metal member to a transparent member, as disclosed in the patent reference below. (Japan Patent Application Publication No. 2001-52364, FIGS. 1 and 2.)

SUMMARY OF THE INVENTION

However, according to the examples there have been the following issues associated therewith, limiting the freedom of design of the outer shape and hermetic sealing of the element.

For example, in an example of structures using a ceramic or metal package, it is difficult to obtain a complicated shape and also necessitating an entire hermetic sealing of the package to be executed. Further, in an example of structure where a substrate on which a light emitting element and the like are mounted is covered with a covering member for hermetical sealing, it is difficult to verify the soundness of its hermetic sealing therebetween in the case the above-mentioned two members are bonded, or a process control in consideration of environmental and time-dependent changes is required.

The present invention is contemplated to address the above-mentioned drawbacks associated with the prior art, to improve the degree of freedom in the design of the integrated optical device and also to ensure hermetic sealing thereof.

The present invention proposes an integrated optical device featuring the following configurations.

An integrated optical device according to the present invention includes a ceramic substrate on which a light source including a light emitting element and the like are mounted, a covering member fixed to the ceramic substrate for covering the light source mounted thereon, and a resin mold casing to which the ceramic substrate is attached.

Hermetic sealing of its light source portion is formed by joining a metal joint section formed in the circumference of the light source portion on the ceramic substrate and a metal joint section formed on the covering member, and by sealing a light path formed in the ceramic substrate or in the covering member (i.e., a hole or notch for passing through a light emitted from the light emitting element) with a sealing member made of a transparent material.

Therefore, according to the present invention, flexibility in designing the outer shapes can be improved as the ceramic substrate mounting the light source portion is attached to a resin mold casing. Further, by joining respective metal joint sections formed on the ceramic substrate and on the covering member corresponding thereto, an improved hermetic seal can be obtained, and also a hermetic sealing exclusively for a required portion including the light emitting element, related optical components and the vicinity thereof can be realized.

According to an aspect of the present invention, the light source portion mounted on the ceramic substrate can be hermetically sealed with the covering member and the sealing member, and other portions that do not require hermetic sealing may be encased in the resin mold casing, thereby enabling for an outer shape design thereof to be performed at a higher degree of freedom, and suitably for down-sizing thereof.

According to another aspect of the present invention, as the heat generated at the light source is effectively transferred from the ceramic substrate to the heat conducting material, an improved heat dissipation is realized thereby ensuring a high performance and reliability of the device.

According to still another aspect of the invention, a relative position of the light emitting element and the light receiving element in a direction orthogonal to the mounting surface of the light source on the substrate can be defined appropriately depending on the necessity of the optical design therein.

BRIEF DESCRIPTION OF THE DRAWINGS

The above and other objects, features and advantages of the present invention will become more apparent from the following description of the presently preferred exemplary embodiment of the invention taken in conjunction with the accompanying drawings, in which.

DESCRIPTION OF THE PREFERRED EMBODIMENTS

The present invention provides an integrated optical device that ensures adequate hermetic sealing by limiting a portion of hermetic sealing to a minimum extent of regions where the light emitting element, optical component and the like are mounted, and also enables a down-sizing and an improved performance thereof to be ensured.

Figure 1:
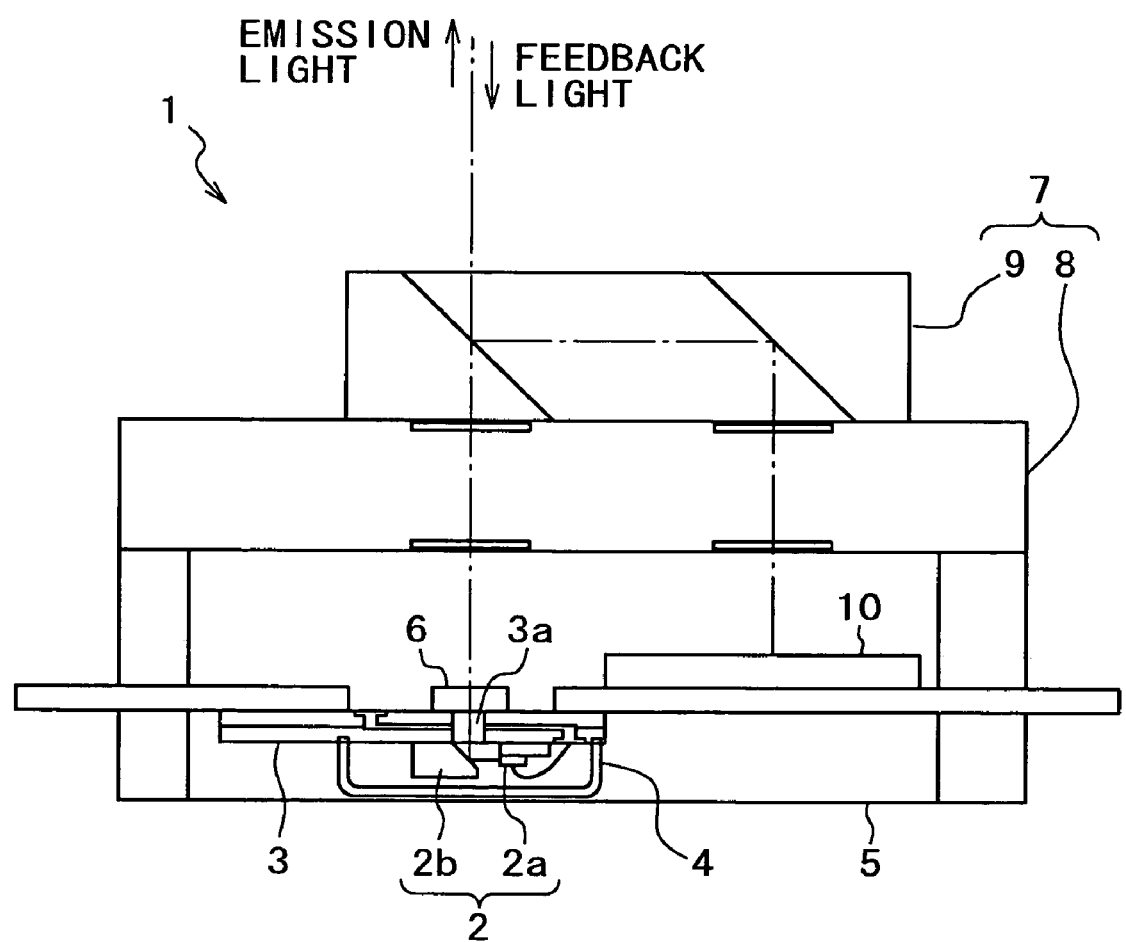
FIG. 1 is a schematic diagram showing a configuration example of an integrated optical device according to an embodiment of the present invention.

By referring to FIG. 1, an exemplary embodiment of an integrated optical device according to the present invention is shown, including a light emitting/receiving device having a light emitting element and a light receiving element.

An integrated optical device 1 includes: a substrate 3 on which a light source section 2 is mounted; a covering member 4 fixed to the substrate 3 for covering the light source section 2; and a casing member (package) 5 to which the substrate 3 is attached.

According to the embodiment of the invention, the light source section 2 is includes a light emitting element 2a such as a semiconductor laser and an optical component such as a prism mirror, both of them being confined in a space formed between a covering member 4 and the substrate 3. Further, a through-hole is formed in the substrate 3 as a light path 3a for allowing a light emitted from the light emitting element 2a to pass through, then this through-hole is closed with a sealing member 6 made of a transparent material.

An optical block 7 is attached to the casing member 5 formed of a resin mold. The optical block 7 includes two optical members 8, 9, of which the optical component 8 is a base member, and the other optical component 9 mounted thereon is a complex prism. Further, various optical components such as a diffraction grating, a wavelength plate, lens and the like are mounted on the optical member 8 to be attached to the casing 5, and further, on the optical member 9 there are mounted an optical branch film, a polarization splitter film, a wavelength plate and the like.

A light receiving element 10 which is fixed on the casing member 5 detects a light entering through the optical block 7.

The integrated optical device 1 which can be applied to various types of optical equipment, measuring instruments, optical recording and reproducing apparatuses, and the like. By way of example, an optical head will be described, which is for use in signal recording and signal reproduction to and from an optical recording medium such as an optical disc, photo-magnetic disc, phase-changing disc or the like. In this arrangement, a light emitted from the light emitting element 2a is changed of its light path by 90° by the optical component 2b, passes through a plurality of optical components provided in the optical member 8, and is emitted toward a disc via a polarization splitter film in the complex prism. The light of emission is radiated over a recording surface of the disc via an external lens system (including an object lens). A feedback light reflected from the recording surface is reflected on the polarization separator film in the complex prism (in the optical member 9) and passes through the optical branch film in the prism so as to allow diffraction light thereof to reach the light receiving element 10 to be detected.

According to the present invention, as possible structures for hermetically sealing the light source section that is mounted on the substrate, for example, the following two examples of configurations are considered.

(I) A first embodiment I is configured such that a covering member is fixed to a portion of a substrate on which a light source section is mounted, and that a light path for allowing the light emitted from a light emitting element to pass through is formed in the substrate, which is then sealed with a sealing member.

(II) A second embodiment II is configured such that a covering member is fixed to a portion of a substrate on which a light source section is mounted, and that a light path for allowing the light emitted from a light emitting element to pass through is formed in the covering member, which is then sealed with a sealing member.

Figure 2:
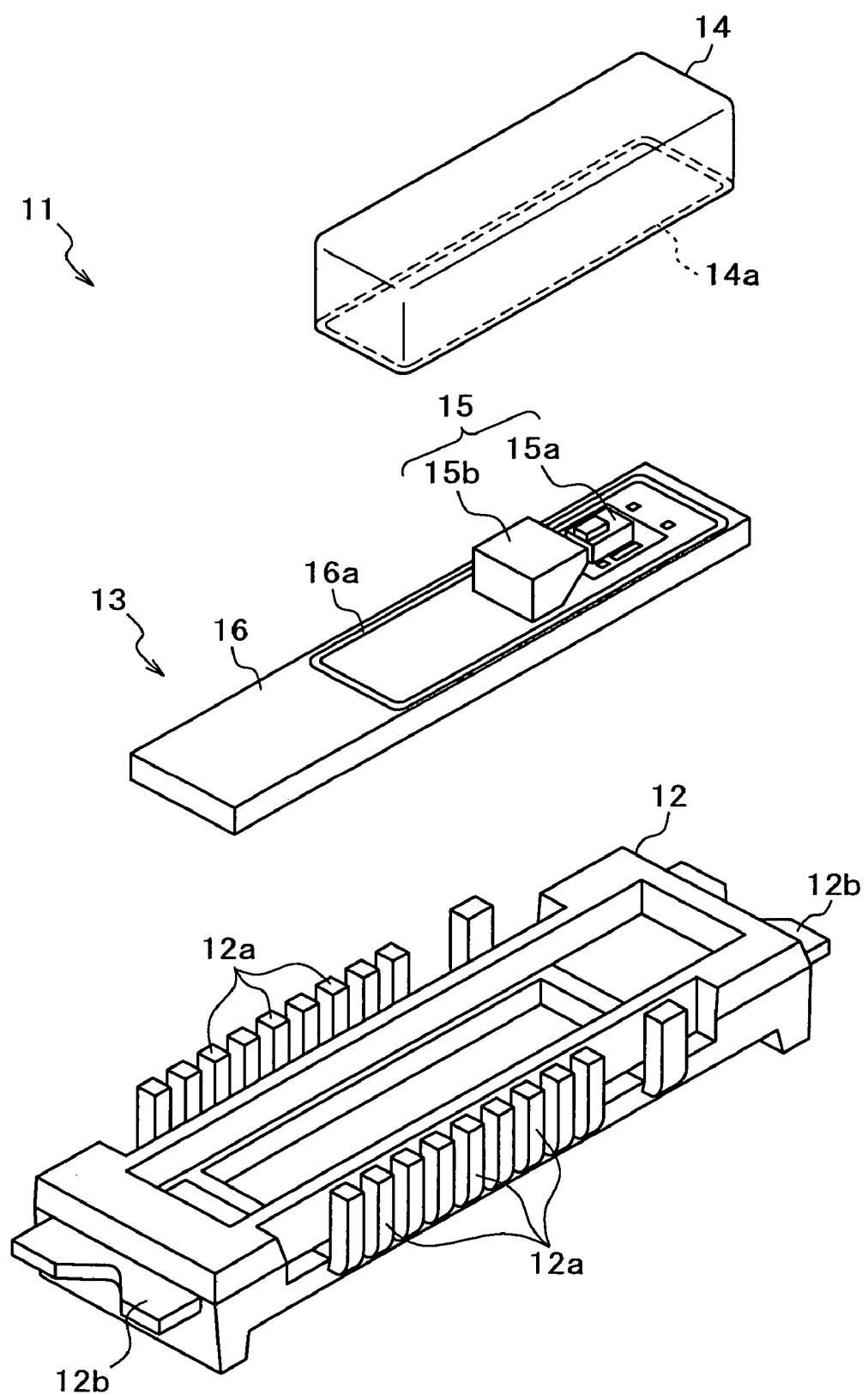
FIG. 2 shows, with FIG. 3 and FIG. 4, an exploded perspective view showing respective main portions of an integrated optical device according to an embodiment of the present invention.
Figure 3:
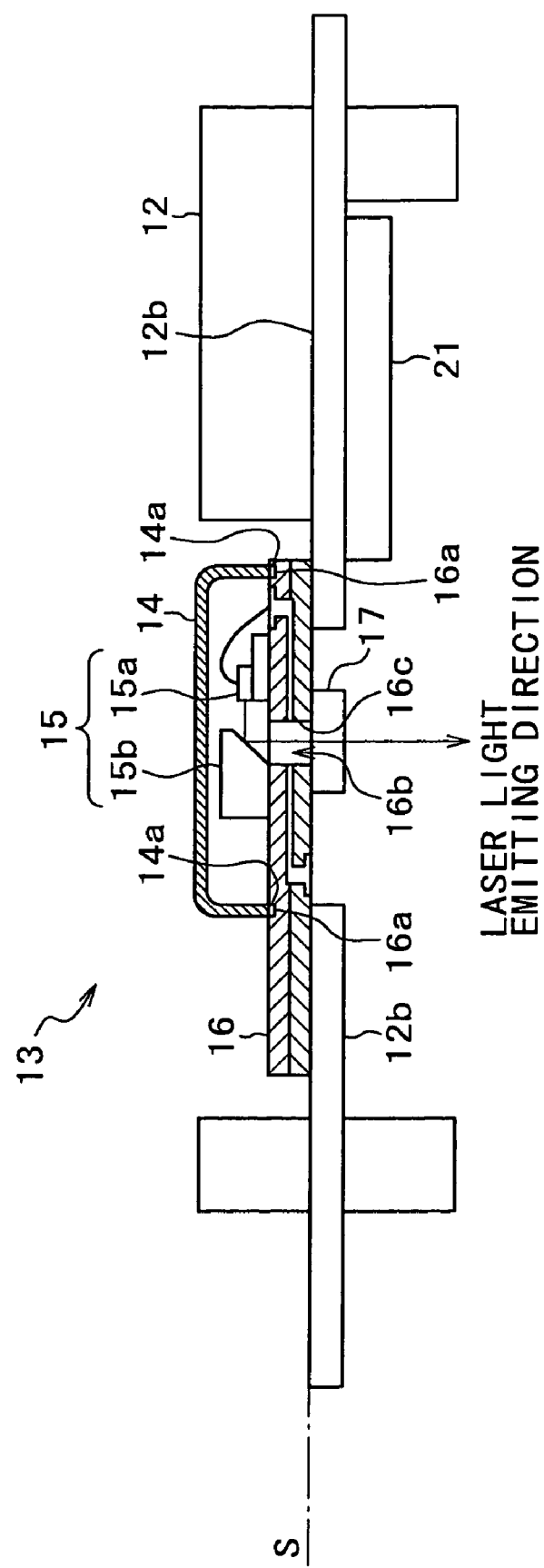
FIG. 3 is a cross-sectional view of the main portion described in FIG. 2.
Figure 4:
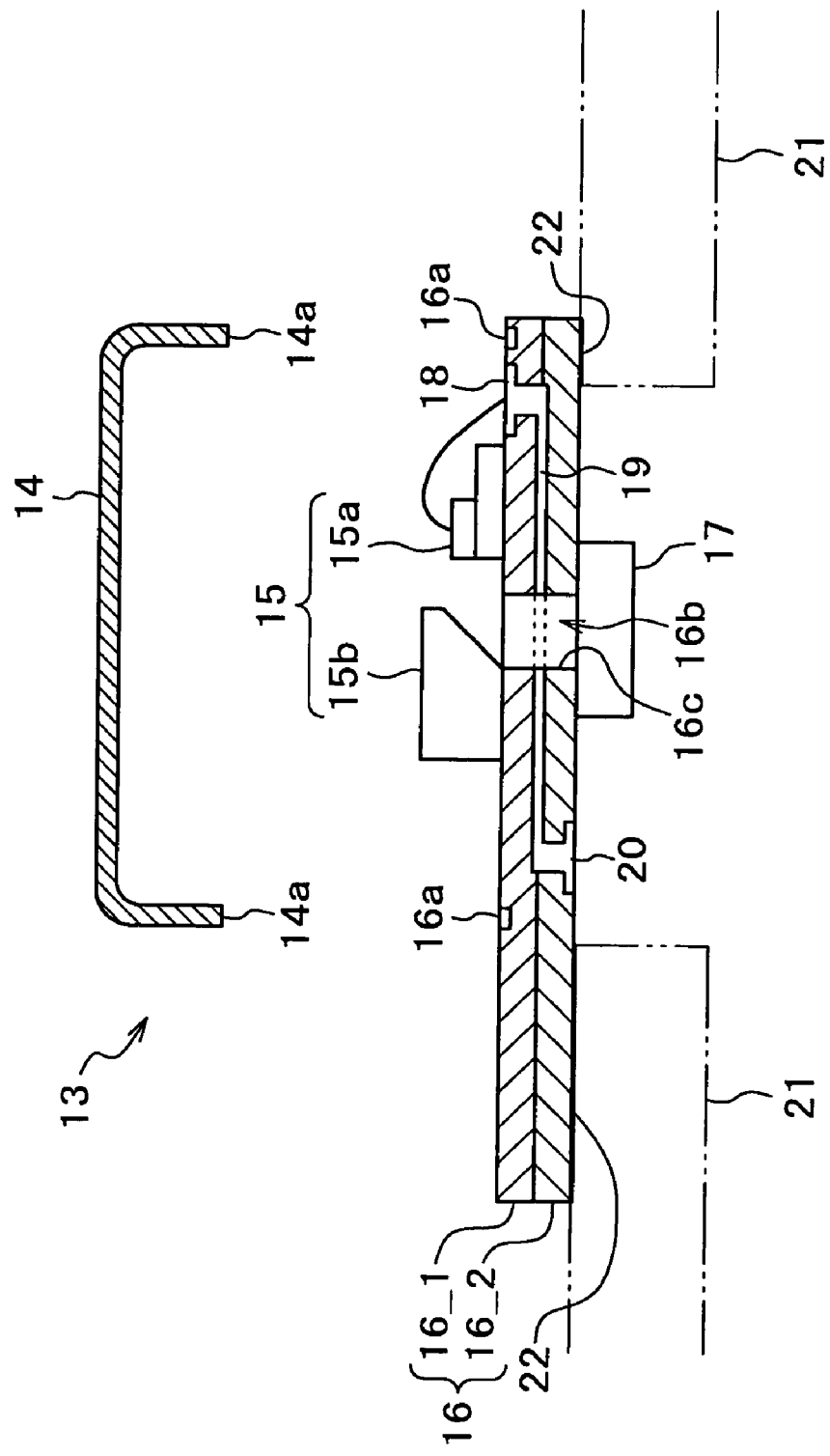
FIG. 4 is a schematic diagram explaining a hermetic sealing of the light source portion in FIG. 2.

Embodiment I:

FIGS. 2 to 4 show an example of configurations of the first embodiment (I) of the present invention, where FIG. 2 shows exploded perspective views of main parts thereof (excepting its optical block) as viewed from the rear side of a package, FIG. 3 shows a schematic cross-section of the main part, and FIG. 4 shows a schematic diagram of main parts for sealing the light source section, where the covering member is removed from the substrate.

As shown in FIG. 2, an integrated optical device 11 has a resin package 12 provided with terminal sections, a substrate 13 with the light source mounted thereon, and a covering member 14 to be fixed to the substrate 13.

The resin package 12 of a resin mold has various functions for mechanically fixing the elements thereto, providing lead-out terminals, dissipating heat, protecting from external atmosphere and the like. For example, a plurality of input/output terminals, lead frames and the like are insert-molded in the resin, and terminal sections 12a having a prescribed number of external lead-out pins is provided for electric connection with an external circuit. The resin package 12 has a reference plate for use when connecting to external parts such as constituent members of an optical pick-up and the like, which are not shown. In this embodiment, lead frames 12b, 12b made of a metal are used therefor. This reference plate has a function as a mechanical support when attaching the resin package to other components, and also a function of heat dissipation by conducting heat generated in the light source, light emitting element and the like to external members.

The substrate section 13 is comprised of a light source section 15, a ceramic substrate 16 and a sealing member 17 as shown in FIGS. 3, 4.

In this embodiment, the light source section 15 is considered to be a laser source, and a laser diode with a laser chip mounted on a mount member is used as a light emitting element 15a. Then, as an optical component 15b constituting the light source section 15, a prism mirror, i.e. a so-called riser mirror, with its reflection surface facing an emitting surface of the laser chip is used for reflecting the light emitted from the laser chip, so that the laser path is changed by 90° in a vertical direction relative to the direction of the laser emission from the laser chip.

The ceramic substrate 16 is, for example, a multi-layered substrate and made of a material that is suitable for blocking gas or liquid such as alumina, aluminum-nitride or the like. On the circumference of a mounting surface on the ceramic substrate 16 for mounting the light source section 15, there is formed a metal joint portion 16a. That is, according to this embodiment I of the present invention, the metal joint portion 16a in a closed-loop (endless) is formed on the ceramic substrate by vapor deposition or plating into a metal film such as to surround a particular portion on the mounting surface of the substrate where the laser diode and the prism mirror are disposed. Further, in the ceramic substrate 16, there is formed a through hole 16c which constitutes a light path 16b through which the light emitted from the light source 15 passes as shown in FIGS. 3 and 4.

The sealing member 17 is formed using a transparent material such as glass or resin having a high melting point. According to this embodiment I of the present invention, this sealing member 17 is fixed on the rear side of the ceramic substrate 16 opposite to the mounting surface of the light source 15 thereof. With this sealing member 17, an opening of the through-hole 16c is closed to be sealed.

The covering member 14 is fixed to the ceramic substrate 16so as to cover the light source 15. Therefore, the covering member 14 has a metal joint portion 14a to join the above-mentioned metal joint section 16a on the side of the substrate. According to this embodiment I, as shown in FIG. 2, the covering member 14 is made into a rectangular parallelepiped shape with an opening on one side, and a rim of the opening defining the metal joint portion 14a thereof and having a shape corresponding to the metal joint section 16a on the substrate to join therewith. The covering member 14 may be formed using a metal, glass, resin or the like. In the case where a metal is used, the rim of its opening becomes by itself the metal joint portion 14a, while in the case of glass or the like, a metal film or the like will have to be formed on the rim of its opening to provide for a metal joint portion 14a.

Hermetic sealing of the light source section 15 on the substrate section 13 is ensured by joining the metal joint section 16a of the ceramic substrate 16 and the metal joint portion 14a of the covering member 14, and further by sealing the light path 16b in the ceramic substrate 16 with the sealing member 17. That is, a high reliability hermetic sealing is achieved by joining the metal joints 16a and 14a with solder or by welding. Also by bonding a transparent material serving as the sealing member 17 onto the opening of the through hole 16c, or by forming a metal film on the ceramic substrate 16 and the sealing member 17 and subsequently soldering or the like therebetween, thereby providing the hermetic structure of the light source 15.

By way of example, although the joining between the covering member 14 and the ceramic substrate 16 may be carried out by bonding, it is difficult to ensure soundness of the hermetic sealing unless a sufficient overlap width of adhesive (width of bonding) is ensured, therefore, it is preferable to adopt the method of the invention described above to join therebetween by means of the metal joints.

By referring to FIG. 4, a power supply to the light source 15 will be described. In this embodiment I, the ceramic substrate 16 has a two-layered structure, wherein a wiring interposed between a first and a second layers electrically connects between the mounting surface on the substrate which mounts the light emitting element and the rear surface thereof on the side where the sealing member 17 is disposed.

More particularly, on the surface of a first layer 16_1 of the ceramic substrate 16, a terminal 18 is provided for connection with the light emitting element 15, the terminal 18 is further connected to a terminal 20 provided on a second layer 16_2 on the rear surface thereof via a wiring pattern 19 formed between the first and the second layers 16_1 and 16_2. This terminal 20 is further connected to an external terminal of the resin mold 12 for external connection, and when a power is supplied thereto from a power circuit (not shown) such as a laser drive circuit, the light emitting element 15a is activated to emit a light, whose light after being changed of its light path by 90° when reflected by the optical component 15b is caused to pass through the through hole 16c, and further through the sealing member 17 to be emitted outside.

By way of example, a metal substrate may be used instead of the ceramic substrate as well, however, in this case, it is necessary to arrange such that a through hole is formed in the substrate and a metal terminal is provided communicating through the through hole without contacting the metal substrate, and interposing an insulation material such as a low-melting point glass or the like between the metal terminal and the substrate for firmly fixing, thereby, its wiring process becomes complicated, and verification of its hermetic sealing is not easy. The use of the ceramic substrate, accordingly, is preferable in consideration of various advantages such as a higher degree of freedom in the lay-out of electrodes and wiring as well as the soundness of hermetic sealing against the gas and liquids in comparison with the metal substrate.

By referring to FIG. 3, the substrate 13 is encased in the resin package 12. Here, a symbol "S" in the drawing depicts a reference plane (a standard datum plane) of the resin package 12 as insert-molded, which is on the rear side of the resin package as viewed from a frontal direction of an outgoing laser beam emission, and wherein the substrate section 13 with the hermetically sealed light source section 15 mounted is disposed on the side of the reference plane "S" and fixed at a prescribed position using a fixing material such as solder, silver paste or the like having a good thermal conductivity. Then, input/output terminals provided on the resin package 12 are wired using, for example, wire bonding or the like.

According to this embodiment I of the invention, a light receiving element 21 is mounted on a surface opposite to the side of the substrate 13 in the resin package 12. This is intended to provide an effect for facilitating its optical design by providing an appropriate optical distance between positions of the light emission point of the light emitting element 21 and the light reception surface by the light receiving element 21 in a direction orthogonal to the mounting surface of the ceramic substrate 16.

By referring to FIG. 4, preferably, heat conducting surfaces 22, 22 made of metal or the like is provided on a part of the ceramic substrate 16 which is to be mounted on the resin package 12, and also heat conducting members 23, 23 having a high thermal conductivity is provided on the resin package 12 so that the heat conducting section 22, 22 are connected to the heat conduction material 23, 23 respectively, in order to improve the heat dissipation of the light source 15. By way of example, according to this embodiment I of the invention, the lead frame 12b made of metal is used also as the heat conducting material for dissipating heat to the outside.

Embodiment II:

Now, by referring to FIGS. 5 and 6, a second embodiment of the present invention having the configuration of the type (II) described above will be set forth in the following. Main parts of an integrated optical device 11A according to the second embodiment II of the invention differ from the optical integrated device 11 of the first embodiment I substantially in the following as will be described below. Thus, the same portions which are identical between the above two embodiments I and II will be indicated using the same numerals and symbols as used in the description of the integrated optical device 11, and further description thereof will be omitted.

(a) A light path 24 is provided in a covering member 14A covering a light source section 15 mounted on a ceramic substrate 16A, and a through hole 24a forming the light path is sealed with a transparent sealing member 25.

Figure 5:
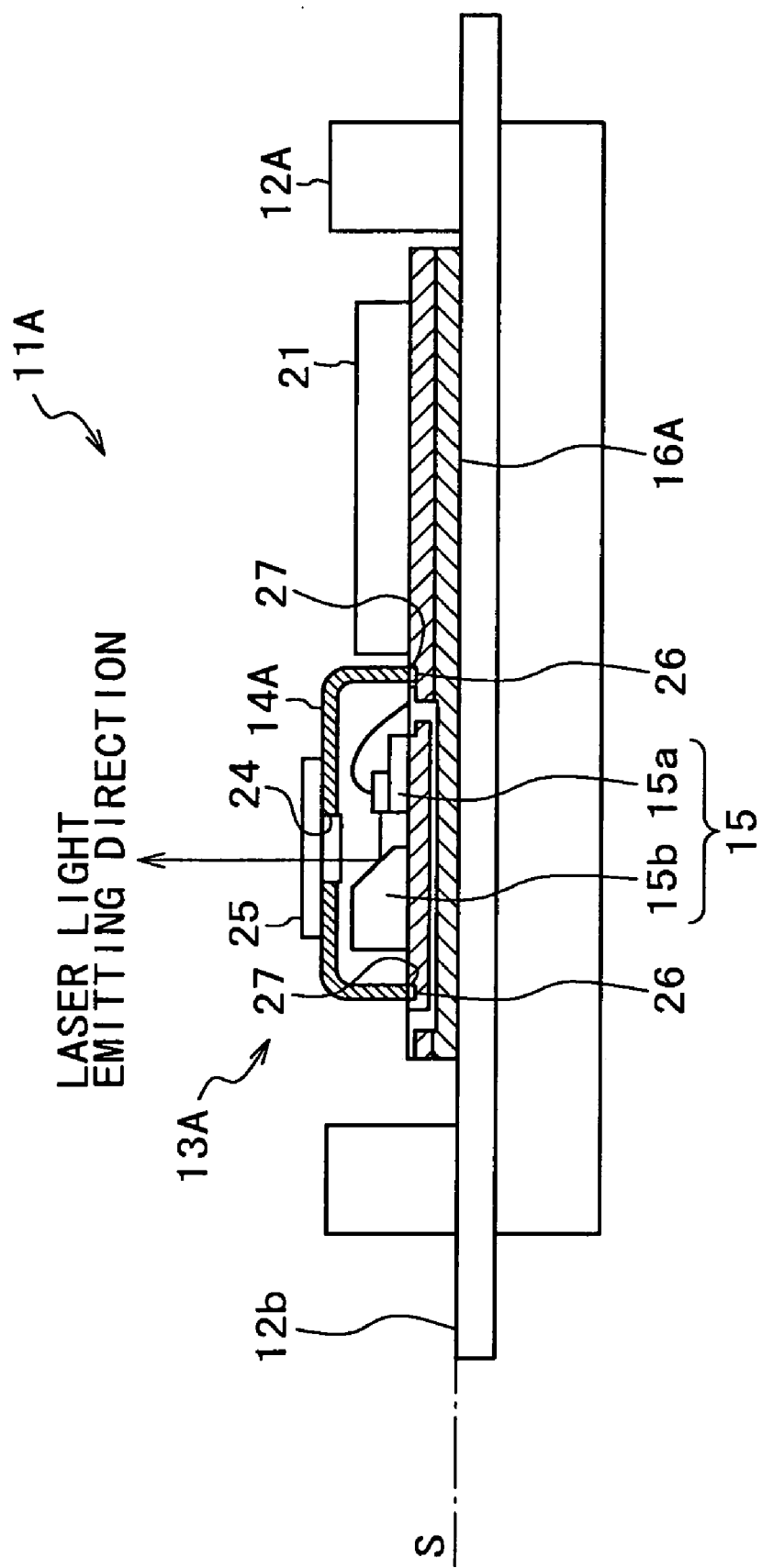
FIG. 5 shows, with FIG. 6, a schematic diagram showing a configuration example of a main part in cross-section of another embodiment according to the present invention.

(b) A light receiving element 21 is mounted on a ceramic substrate 16A, and a substrate section 13A having both the light receiving element 21 and a hermetically sealed light source section 15 mounted thereon is fixed on the same side of a reference plane, referred to as "S" in FIG. 5, i.e. in the same direction from the reference plate (a lead frame and the like) in a resin package 12A.

The integrated optical device 11 according to the embodiment I of the invention where the substrate 13 mounting the light source is disposed on the rear side of the resin package 12 if it is viewed from a counter direction of an outgoing emitting light. On the other hand, in the integrated optical device 11A according to this embodiment II of the present invention, its substrate 13A is disposed on the reference plane which is set at the frontal side of the resin package 12A if it is viewed from a counter direction of an outgoing light from the light source 15.

Figure 6:
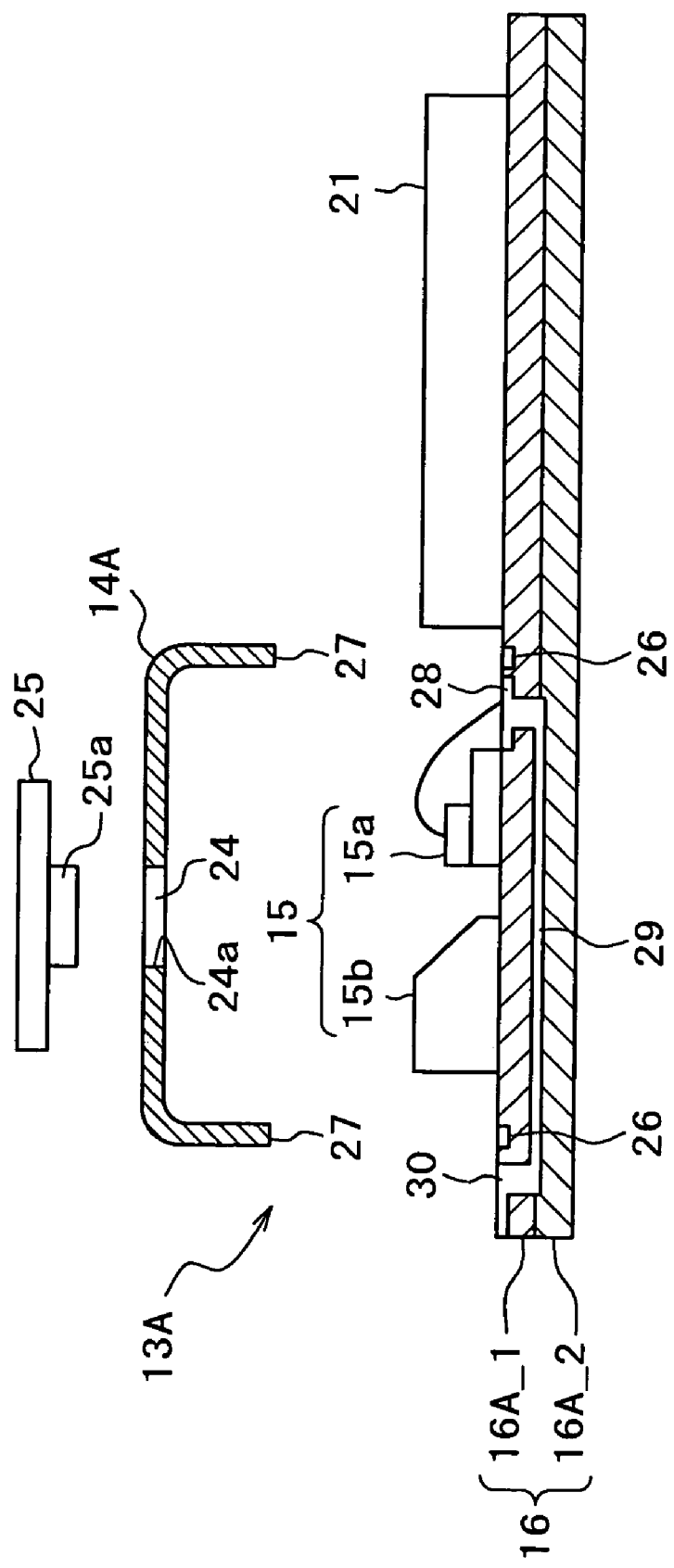
FIG. 6 is a cross-sectional view of the main portion described in FIG. 5 showing a hermetic sealing for its light source portion.

By referring to FIG. 6, a covering member 14A is fixed to a ceramic substrate 16A by joining a metal joint portion 26 formed in the circumference of the light source 15 on the ceramic substrate 16A and a metal joint portion 27 of the covering member 14A with solder or by welding. By sealing a through-hole 24a provided in the covering member 14A with a sealing member 25, a hermetically sealed structure for the light source section 15 is obtained. By way of example, in this embodiment II of the invention, a portion 25a of the sealing glass is inserted into the through-hole 24a and fixed thereto with adhesive or the like.

A power supply to the light source 15 is provided as shown in FIG. 6, where the ceramic substrate 16A has a two-layered structure, and on the surface of a first layer "16A_1" of the ceramic substrate 16A, i.e., a mounting surface, there is provided a terminal 28 for connection with the light emitting element 15a, the terminal 28 of which is interconnected to another terminal 30 provided on the surface of the first layer "16A_1" via a wiring pattern 29 formed between the first layer "16A_1" and a second layer "16A_2". This terminal 30 is connected to an external terminal of the resin package 12A for external connection. When a power is supplied from an external circuit such as a laser drive circuit (not shown), the light emitting element 15a is activated to emit a light, which light after changing its light path by 90° on an optical component 15b and passing through a through-hole 24a and a sealing member 25 is emitted to the outside.

Further, the light receiving element 21 is disposed on the surface of the ceramic substrate 16A on the side of where the light source section 15 is mounted. This exemplifies an instance where the position of emission point of the light emitting element 15a and the position of receiving surface of the light receiving element 21 is set identical or in proximity in a direction parallel to the outgoing direction of the light from the light source 15, i.e., a perpendicular direction relative to the mounting surface of the substrate 16A, as required in consideration of its optical design when a short wavelength laser or the like is used.

According to this embodiment II of the present invention, by securing a sufficient length in a longitudinal direction of the substrate so as to allow for both of the light source section 15 and the light receiving element 21 to be mounted on the same substrate, it is enabled to set the positions of the emission point of the light and the receiving surface of the light at the same position or height in the direction orthogonal to the mounting surface of the substrate.

According to the arrangements of the embodiments I and II of the invention described above, the following advantages can be obtained.

Only those portions such as the laser diode that require sealing in the integrated optical device are hermetically sealed, and the other portions that do not require the hermetic sealing are packaged in a resin mold, thereby enabling to design its outer shape at an increased degree of freedom. Accordingly, by limiting the hermetic sealing to minimum necessary portions, downsizing an integrated optical device can be realized.

By minimizing a volume of portions that requires the hermetic sealing, a highly efficient hermetic sealing can be achieved.

As the hermetically sealed portions can be encased inside the resin package, an improved degree of freedom in the design thereof can be ensured.

By use of the ceramic substrate having a high thermal conductivity, an improved heat dissipation capability is ensured when heat source elements are mounted thereon.

By arranging so that the light receiving element is mounted on the rear surface opposite to the surface on which the ceramic substrate is mounted in the resin package, the optical design becomes easier. Alternatively, the light receiving element may be mounted also on the same mounting surface as the light emitting element on the ceramic substrate depending on its design specification.

As to the embodiments I and II described hereinabove, the light emitting element and the optical components are covered by the covering member, however, it is not limited thereto, and various other modifications and changes should be construed within the scope of the present invention such as that an output monitor circuit for the light emitting element, a temperature sensor and the like are also covered by the covering member together with the light emitting element.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. An integrated optical device comprising:
    a ceramic substrate on which a light source including a light emitting element is mounted and a light path for passing through a light emitted from said light emitting element is formed;
    a covering member attached to said ceramic substrate for covering said light source mounted on said ceramic substrate; and a resin mold casing to which said ceramic substrate is attached; wherein, hermetic sealing of said light source portion is formed by joining a metal joint section formed in circumference of said light source portion on said ceramic substrate and a metal joint section formed on said covering member and by sealing said light path with a sealing member made of a transparent material.

2. The integrated optical device according to claim 1, wherein a heat conducting surface is provided on an attachment portion that is jointed with said resin mold casing in said ceramic substrate and connected to a heat conducting member provided on said resin mold casing.

3. The integrated optical device according to claim 1, wherein a light receiving element is mounted on a surface opposite to a surface on which said ceramic substrate is mounted in said resin mold casing.

4. The integrated optical device according to claim 1, wherein said light emitting element is a semiconductor laser.

5. The integrated optical device according to claim 1, wherein a light path of said light emitting element is deflected by 90° by an optical component.

6. The integrated optical device according to claim 1, wherein said ceramic substrate is a multilayer substrate.

7. The integrated optical device according to claim 6, wherein said multilayer substrate has interlayer wiring.

8. An integrated optical device comprising:

a ceramic substrate on which a light source including a light emitting element is mounted;

a covering member being attached to said ceramic substrate for covering said light source mounted thereon, said covering member being provided with a light path for passing through a light emitted from said light emitting element; and a resin mold casing to which said ceramic substrate is attached; wherein, hermetic sealing of said light source portion is formed by joining a metal joint section formed in said circumference of said light source portion on said ceramic substrate and a metal joint section formed on said covering member, and by sealing said light path with a sealing member made of a transparent material.

9. The integrated optical device according to claim 8, wherein a heat conducting surface is provided on an attachment portion that is jointed with said resin mold casing in said ceramic substrate and connected to a heat conducting member provided on said resin mold casing.

10. The integrated optical device according to claim 8, wherein a light receiving element is mounted on the same mounting surface as said light source on said ceramic substrate.

11. The integrated optical device according to claim 8, wherein said light emitting element is a semiconductor laser.

12. The integrated optical device according to claim 8, wherein a light path of said light emitting element is deflected by 90° by an optical component.

13. The integrated optical device according to claim 8, wherein said ceramic substrate is a multilayer substrate.

14. The integrated optical device according to claim 13, wherein said multilayer substrate has interlayer wiring.

* * * * *